(12) United States Patent
Phang et al.

(10) Patent No.: US 6,480,709 B2
(45) Date of Patent: Nov. 12, 2002

(54) METHOD FOR REDUCING SCAN TIME IN A RADIO RECEIVER

(75) Inventors: Wayne M. Phang, Coral Springs, FL (US); John K. McKinney, Plantation, FL (US); Dang Vu, Coconut Creek, FL (US)

(73) Assignee: Motorola, Inc., Schaumburg, IL (US)

( * ) Notice: Subject to any disclaimer, the term of this patent is extended or adjusted under 35 U.S.C. 154(b) by 36 days.

(21) Appl. No.: 09/764,037

(22) Filed: Jan. 19, 2001

(65) Prior Publication Data

US 2002/0098819 A1 Jul. 25, 2002

(51) Int. Cl.[7] .............................. H04B 1/06; H04B 7/00
(52) U.S. Cl. ................. 455/260; 455/161.1; 455/161.2; 455/266; 375/376
(58) Field of Search ........................... 455/161.1, 161.2, 455/266, 340, 260, 264; 375/376; 340/7.42

(56) References Cited

U.S. PATENT DOCUMENTS

| | | | | |
|---|---|---|---|---|
| 4,365,349 A | * | 12/1982 | Ogita et al. ............... | 455/192.2 |
| 5,027,431 A | | 6/1991 | Tanaka et al. ............... | 455/214 |
| 5,058,204 A | * | 10/1991 | Tahernia et al. .......... | 455/183.1 |
| 5,438,688 A | | 8/1995 | Masaki .................... | 455/161.2 |
| 5,511,235 A | * | 4/1996 | Duong et al. ................ | 455/75 |
| 5,519,890 A | * | 5/1996 | Pinckley .................... | 455/307 |
| 5,701,598 A | * | 12/1997 | Atkinson ................. | 455/161.2 |
| 5,799,241 A | | 8/1998 | Matsubara et al. ........... | 455/62 |
| 5,809,419 A | | 9/1998 | Schellinger et al. ........ | 455/434 |
| 5,894,592 A | * | 4/1999 | Brueske et al. .............. | 455/86 |
| 6,070,062 A | * | 5/2000 | Yoshida et al. .......... | 455/234.1 |

\* cited by examiner

*Primary Examiner*—Edward F. Urban
*Assistant Examiner*—Temica M. Davis
(74) *Attorney, Agent, or Firm*—Randi L. Dulaney; Daniel C. Grilly

(57) ABSTRACT

A receiver (600) uses a scanning technique (100) to minimize scan time. An initial bandwidth setting is selected that covers multiple channel frequencies (106). A signal detection step (108) is performed looking for channel activity. As channel activity is detected, the bandwidth of a baseband filter (628) is narrowed (140, 146). The radio remains programmed to the same channel while the bandwidth is varied. Once the last signal detection with the narrowest possible bandwidth setting has been determined (144, 150, 152) the radio is programmed to that channel. Thus, more than one channel frequency is capable of being scanned without reprogramming the radio to a new channel for each scan.

6 Claims, 6 Drawing Sheets

100

METHOD FOR REDUCING SCAN TIME IN A RADIO RECEIVER

TECHNICAL FIELD

This invention relates to radio receivers and more specifically to scan operations used in radio receivers.

BACKGROUND

Scanning is a technique by which many communication receiver devices detect and lock on a frequency channel when qualified signal activity is present on that channel. In most two-way radios or other FM tuners that have scan capability, each individual channel frequency in a scan list is scanned in search of channel activity in increasing order until the last frequency in the scan list is reached. The scanning then continues from the beginning of the list. In this typical scanning technique, a voltage controlled oscillator (VCO) within a phase lock loop (PLL) tunes to each frequency/channel in the scan list, one channel at a time, so that channel activity detection can be performed. The scan operation stops on a channel whenever a qualified signal (i.e. channel activity) is detected on that channel.

One of the significant limitations with existing scan techniques is the time delay required for the VCO/PLL to lock on each frequency in the scan list. The VCO/PLL lock time is typically the most significant time delay of the scanning function. Lock times for each channel on the order of 10 milliseconds (ms) are common, not including the signal detection time or channel activity search time.

The entire scan list for a typical radio receiver usually covers many channels over several megahertz of frequency range. A large frequency scan list contributes to communication problems including missed calls, missed channel activity detections, as well as delays in establishing a communications link. Missed calls, delays, and link failures are sources of annoyance and inconvenience for the user.

Accordingly, an improved scanning technique that minimizes delays would be beneficial in today's communication's environment.

DESCRIPTION OF THE PREFERRED EMBODIMENT

Figure 1:
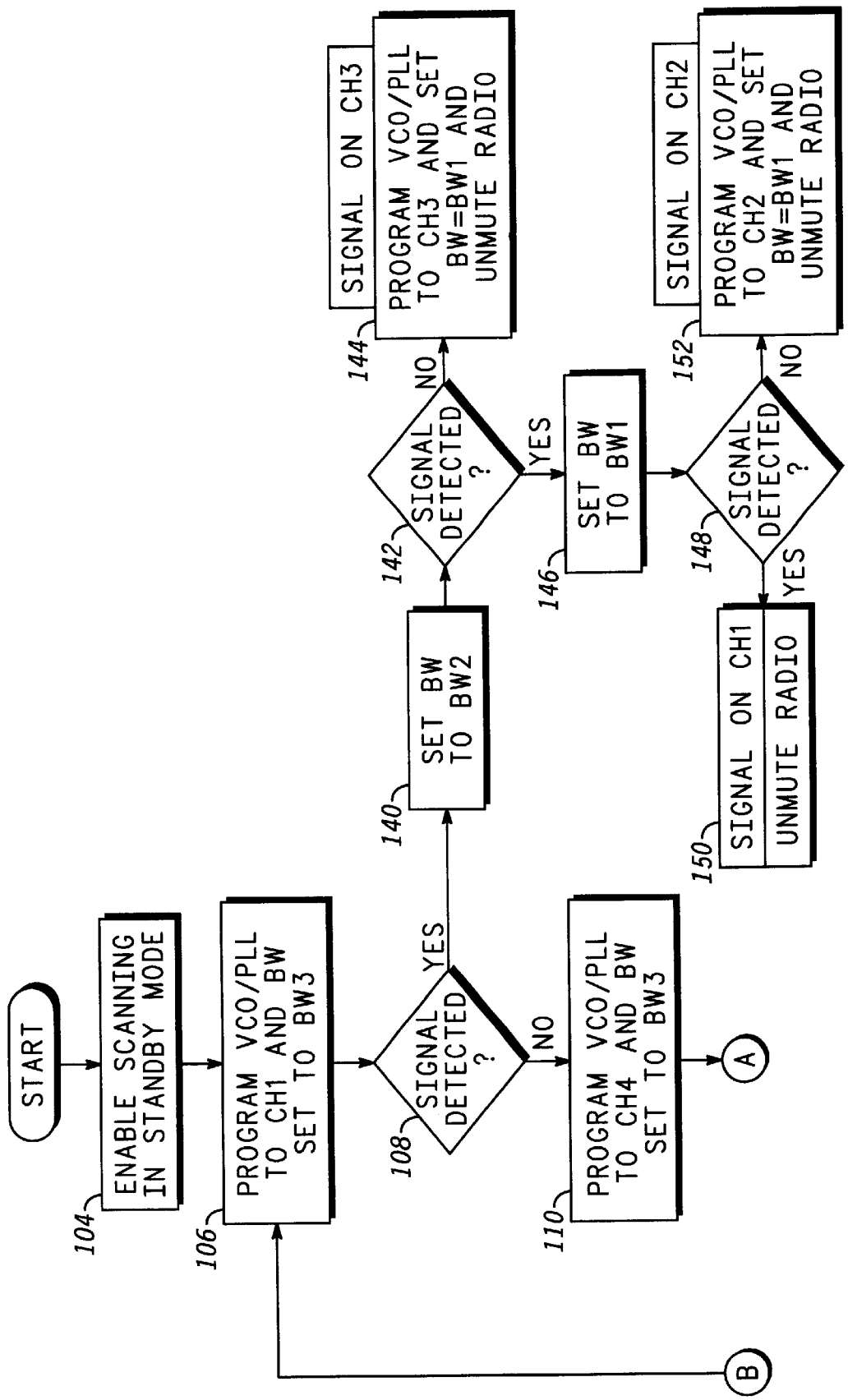
FIG. 1 is a flow chart of a scanning technique in accordance with a preferred embodiment of the invention.
Figure 2:
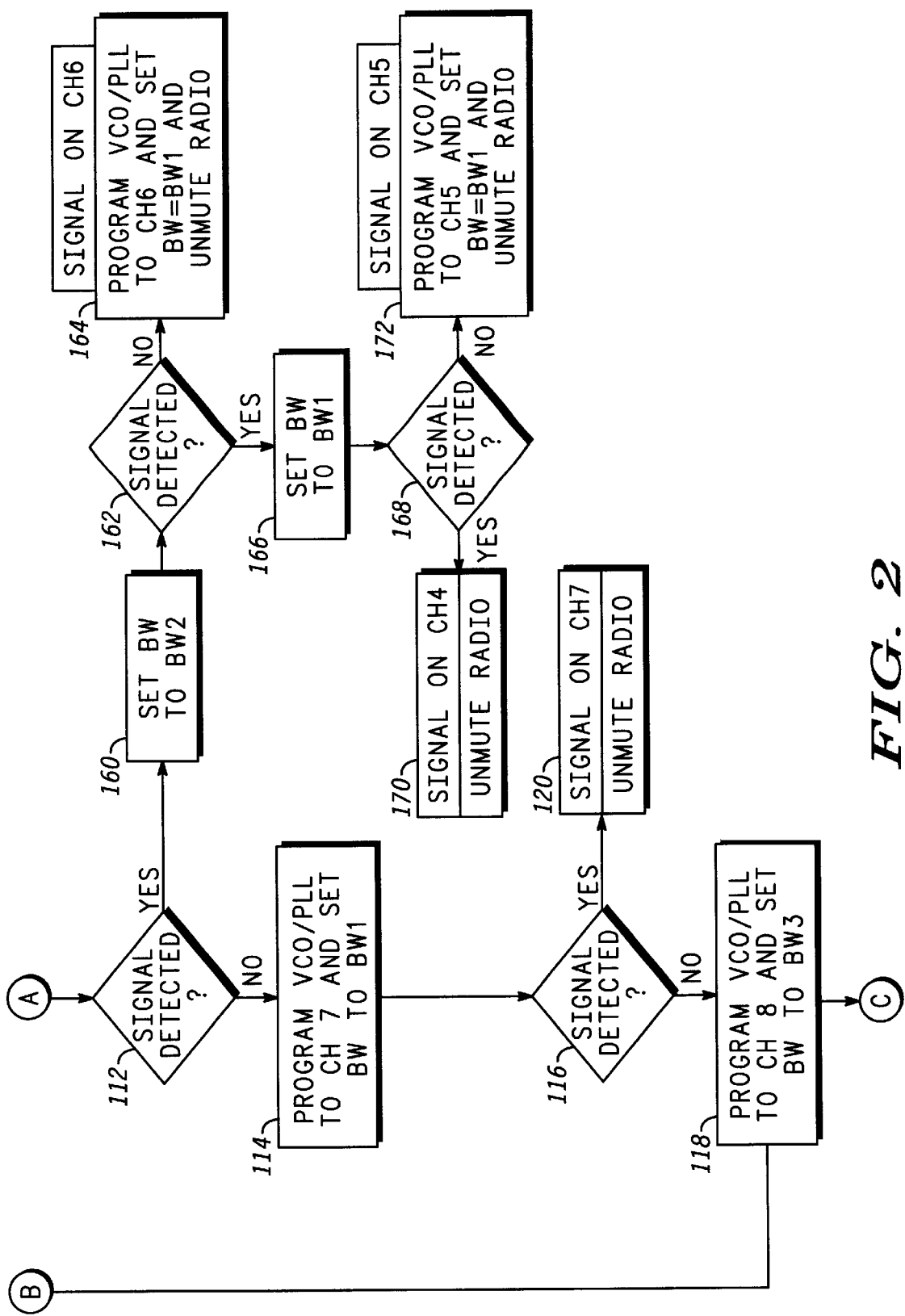
FIG. 2 is a continuation of the flow chart of FIG. 1 in accordance with the preferred embodiment of the invention.
Figure 3:
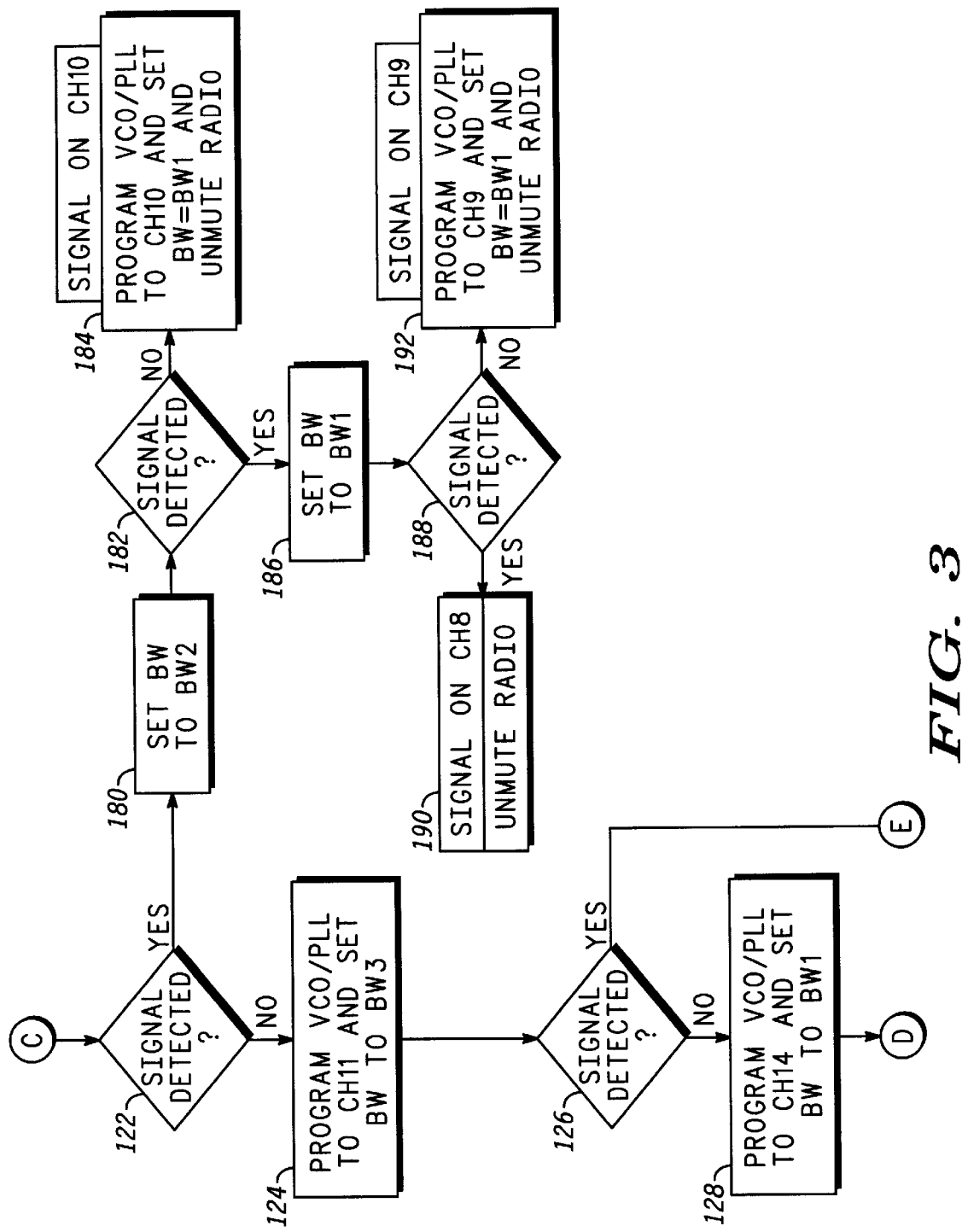
FIG. 3 is a continuation of the flow chart of FIG. 1 in accordance with the preferred embodiment of the invention.
Figure 4:
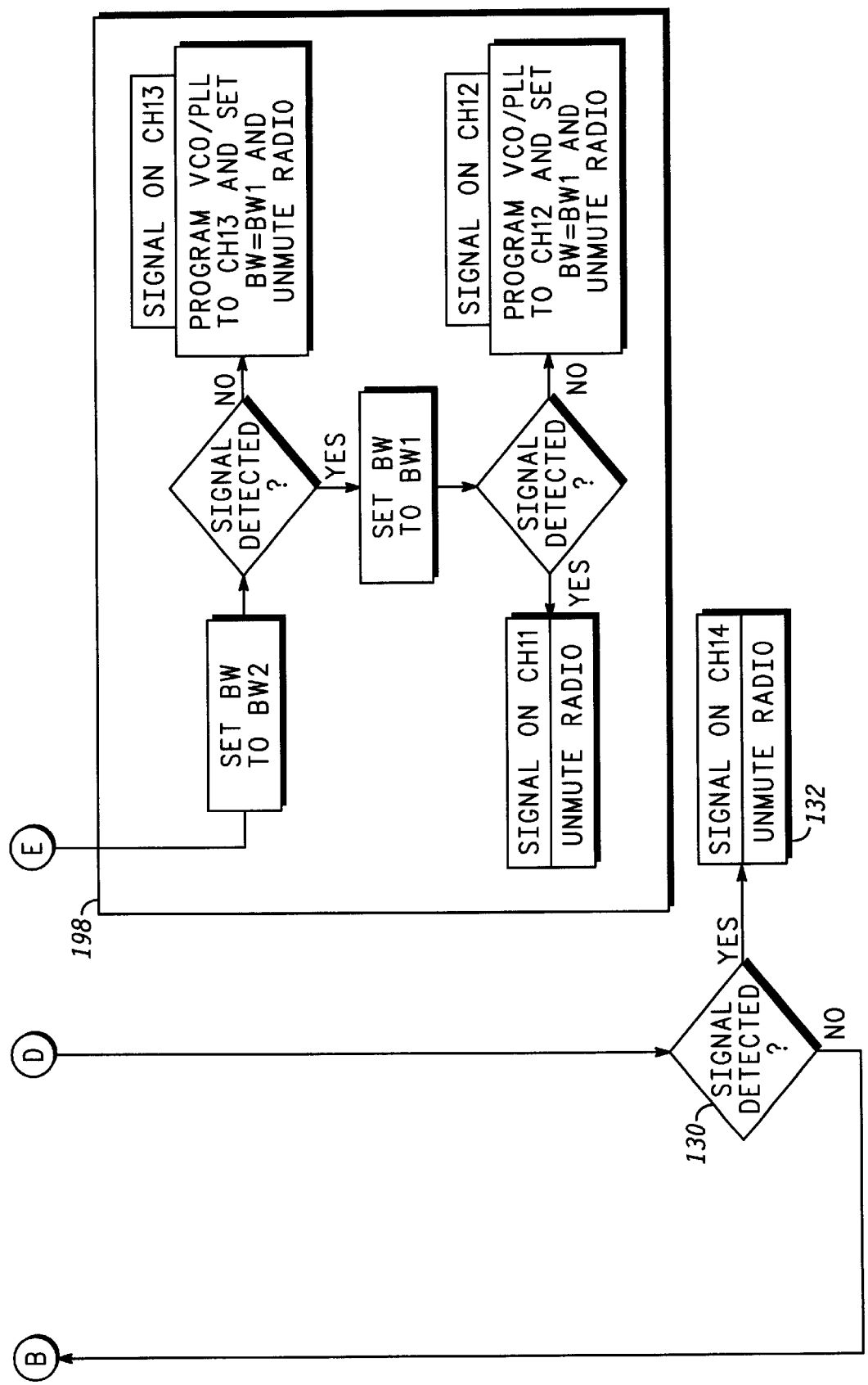
FIG. 4 is a continuation of the flow chart of FIG. 1 in accordance with the preferred embodiment of the invention.

While the specification concludes with claims defining the features of the invention that are regarded as novel, it is believed that the invention will be better understood from a consideration of the following description in conjunction with the drawing figures.

Briefly, in accordance with the present invention a multiple channel signal detect method is provided which scans blocks of frequency containing multiple channels, to detect if a signal is present on any of the channels within the frequency blocks. If no signal is detected in a particular frequency block, the next frequency block is scanned. By providing a programmable baseband filter frequency bandwidth with a wide enough setting to cover several frequency channels, the benefits of multiple channel signal detection are now achieved. When a signal is identified within a frequency block, the programmable bandwidth is varied in order to lock on to an appropriate corresponding channel with which to receive the signal. The scanning method of the present invention allows for more than one channel frequency to be scanned simultaneously. By scanning multiple channels at a time, the scanning method of the present invention is able to significantly reduce average scan times for products with large scan lists.

Figure 5:
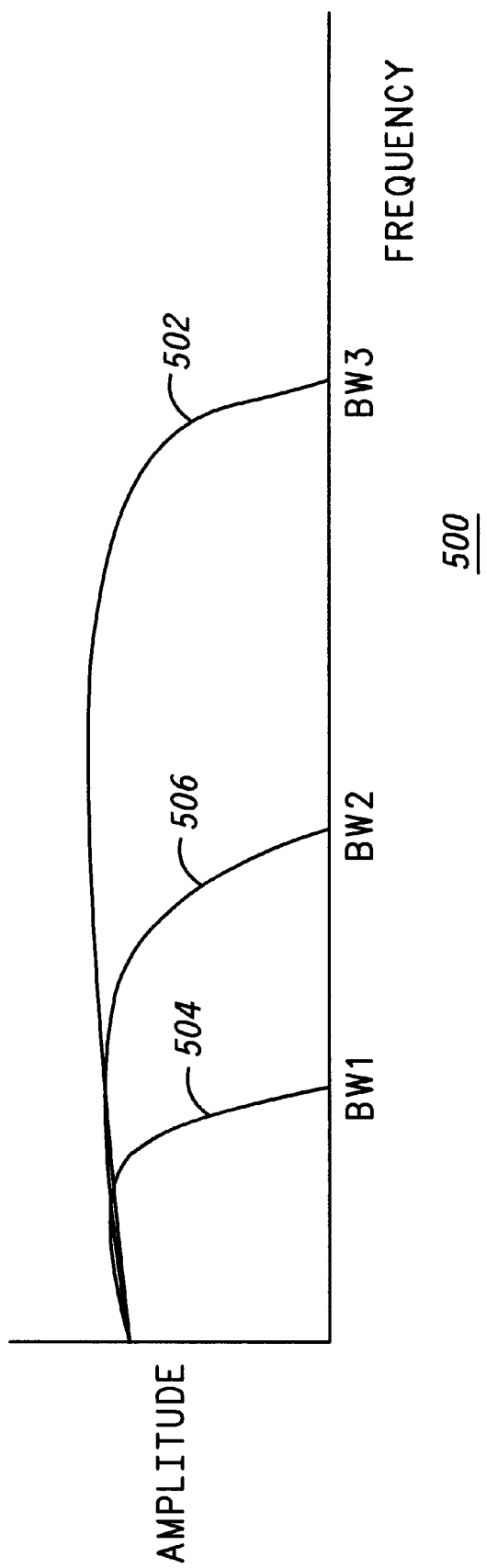
FIG. 5 is an example of a graph depicting different baseband filter bandwidths (frequency vs. signal amplitude) for a system using the scanning technique described in the preferred embodiment.

FIGS. 1, 2, 3, and 4 show a flowchart 100 of a scanning technique in accordance with a preferred embodiment of the invention FIG. 5 shows an example of a graph 500 displaying multiple baseband filter bandwidths (BW1, BW2, BW3) that correspond with the preferred embodiment of FIG. 1–4. The graph 500 shows relative relationships between different baseband filter bandwidths (frequency) and signal amplitude. As seen from the graph 500 BW1<BW2<BW3.

As an example, for the preferred embodiment, a Family Radio Service (FRS) radio having fourteen channels (CH1-CH14) will be used. For this example, the channel spacing between each of CH1-CH7 and between each of CH8-14 is 25 kHZ; and the spacing between CH1 and CH8 is 5 MHz, the spacing between CH2 and CH9 is 5 MHz, and so on. Referring to FIG. 1, the radio starts its scan operation at step 104 either upon power up or via a user selectable scanning feature incorporated into the radio. In accordance with the present invention, scan operation is enabled at step 104 in standby mode which means that the radio is in receive mode with the audio muted. In accordance with the present invention, once the scan operation is enabled, the radio is programmed to some predetermined channel, preferably the last frequency channel that the radio was previously set to by the user, and the baseband filter bandwidth (BW) is set to an initial bandwidth setting. For the preferred embodiment, the initial power up channel will be assumed to be channel 1 (CH1) with an initial baseband filter bandwidth setting of BW3 at step 106. In accordance with the present invention, the baseband filter bandwidth at step 106 is selected to be wider than the normal receiver baseband filter bandwidth and is selected to be wide enough to cover a predetermined number of channels. As shown in FIG. 5, BW3 502 is wider than the normal receive baseband filter bandwidth (BW1) 504 and in this particular example is selected to be wide enough to cover three channels (the original channel as well as two adjacent channels). Signal detection is performed at step 108. If receiver activity is not detected at step 108 on any of the three channels covered by BW3, then the radio's VCO/PLL is programmed to a new frequency different from these three channel frequencies, such as CH4, with the bandwidth set to the original wider bandwidth (BW3), at step 110.

Again, signal detection occurs at step 112 (see FIG. 2) and if a signal is not detected, the technique proceeds to program the VCO/PLL to the next frequency block at step 14. In this example, due to the channel spacing of the FRS radio, this frequency block covers only channel 7 with a bandwidth set to the narrowest setting of BW1. Since the preferred embodiment example describes a FRS radio in which both CH7 and CH14 are lone channels in their respective frequency blocks, rapid scanning can be achieved by having these particular channels scanned over the narrower BW1. A check for signal activity within the new frequency block is then performed at step 116, and if activity is detected then the signal is unmuted on channel 7 at step 120. If no activity is detected at step 116, the scanning technique programs the VCO/PLL to the next channel, CH8 at step 118, with a bandwidth setting set to the original bandwidth setting, BW3, that covers this channel as well as CH9 and CH10. If no signal is detected at step 122 (see FIG. 3), then the VCO/PLL is reprogrammed, at step 124, to the next channel with the original bandwidth setting. Thus, in this example, the VCO/PLL is reprogrammed to CH11 with a bandwidth setting of BW3 to cover this channel as well as CH12 and CH13. If no signal is detected at step 126, then the VCO/PLL is reprogrammed for the next channel setting, in this case CH14 with a bandwidth setting of BW1 at step 128. Again, since CH14 is a lone channel in the frequency block, scan time can be reduced by scanning over the narrower bandwidth setting of BW1. If a signal is detected at step 130 (see FIG. 4), then the radio is unmuted on CH14 at step 132. If no signal is detected at step 130, the scan technique returns to step 106 to scan through the frequency blocks again.

The scanning technique of the present invention only requires the VCO/PLL to initially lock on a single initial frequency and then, in accordance with the present invention, set the baseband filter bandwidth to an appropriate setting. If any signal detection is determined at any VCO/PLL settings (i.e. radio channels), then the baseband BW will be reduced to a narrower bandwidth, for example from BW3 to BW2. This BW2 is represented on the graph 500 of FIG. 5 by designator 506. In this example of a FRS radio, BW2 was selected to be wide enough to cover two of the channel frequencies for a given VCO/PLL setting (the programmed frequency and one adjacent channel). Thus, if a signal is detected at step 108, then the baseband bandwidth is set to a narrower bandwidth setting of BW2 at step 140. If there is no signal activity detected while in the BW2 setting at step. 142, then the technique concludes at step 144 by programming the VCO/PLL to the third of these channels (CH3) with the baseband bandwidth set back to the original/nominal BW1 and the radio is unmuted.

If signal activity is detected at step 142, then the baseband bandwidth gets narrowed to BW1 at step 146. If signal activity is present at this point as determined at step 148, the scan search is complete and the radio is unmuted at step 150 on channel 1 (CH1) with the baseband bandwidth set to the narrowest bandwidth setting (BW1). If no signal is detected at step 148, the VCO/PLL is programmed to the second channel (CH2) with the baseband bandwidth set to the narrowest bandwidth (BW1), and the radio is unmuted thus completing the search at step 152.

Moving to the next frequency block at step 110, similar steps are mirrored from step 112 as seen in steps 160, 162, 164, 166, 168, 170, and 172. Thus, once a signal is detected within the wider bandwidth, the bandwidth is subsequently narrowed (steps 160, 166), and the step of signal detection is repeated (steps 162, 168) until the appropriate channel is determined with which to unmuted the radio. Thus, if signal detection occurs at step 112, the radio will ultimately be unmuted on either CH6, CH5, or CH4 with the narrowest bandwidth setting of BW1 (steps 164, 172, or 170).

Similar steps are mirrored once again from step 122 as seen in steps 180, 182, 184, 186, 188, 190, 192. Thus, once a signal is detected within the wider bandwidth, the bandwidth is subsequently narrowed, and the step of signal detection is repeated until the appropriate channel is determined with which to unmuted the radio. Thus, if signal detection occurs at step 122, the radio will ultimately be unmuted on either CH10, CH9, or CH8 with the narrowest bandwidth setting of BW1 (steps 184, 192, or 190).

Similar steps are mirrored once again from step 126 as shown within designator 198. Once a signal is detected within the wider bandwidth, the bandwidth is subsequently narrowed, and the step of signal detection is repeated until the appropriate channel is determined with which to unmuted the radio. Thus, if signal detection occurs at step 126, the radio will ultimately be unmuted on either CH13, CH12, or CH11 with the narrowest bandwidth setting of BW1.

In accordance with the present invention; the radio remains programmed to the same channel even after a signal is detected while the baseband filter bandwidth is at its widest bandwidth setting (BW3). The radio then undergoes the reduction in baseband filter bandwidth settings while still programmed to this channel so long as the signal is still being detected. Once the signal detection step with the narrowest possible bandwidth setting has been determined, the radio is then programmed to that corresponding channel. Thus, by varying the baseband filter bandwidth setting, more than one channel frequency is capable of being scanned without reprogramming the radio to a new channel.

In summary, in accordance with the present invention, simultaneous channel scanning is achieved by creating a single channel frequency block having selectable bandwidth settings that cover multiple channel frequencies within the block. Scanning within each block consists of locking on a channel with the radio programmed to the widest available bandwidth, and continuing to narrow the bandwidth to the narrowest available bandwidth upon which signal activity is detected. Scanning time is reduced by having the VCO/PLL remain locked on one channel and varying the bandwidth settings such that other channels encompassed by the variable bandwidths are checked for activity. If channel activity is not detected within the frequency block covered by the widest bandwidth setting, the scanning technique of the present invention moves to a whole new frequency block, thus being able to move through several channels at a time.

Though the preferred embodiment describes a predetermined bandwidth setting covering a three channel span (CH1 with bandwidth BW3 covers CHs1, 2, 3), (CH4 with BW3 covers CHs4, 5, 6), (CH8 with BW3 covers CHs8, 9, and 10), and (CH11 with BW3 covers CHs11, 12, 13), the baseband filter can be programmed for different bandwidth settings to cover wider or narrower frequency blocks as appropriate. Thus, the scanning technique of the present invention lends itself well to a variety of communication systems, but is particularly well suited for the Family Radio Service (FRS) system because there are only a limited number of the frequency blocks in the FRS frequency band. As mentioned earlier, for the FRS band example, each channel within channels 1-7 and 8-14 are only 25 kHz apart; and CH8 is 5 MHz apart from CH1, CH9 is 5 MHz away from CH2, and so on. In radio systems having 12.5 or 6.25 kHz channel spacing, the scanning technique of the present invention also lends itself well to covering several channels in the initial baseband bandwidth because the channels are not too far apart frequency-wise. Depending on the number of channels in a scan list and the spacing between those channels, many systems can benefit from the scanning technique of the present invention.

The VCO (or VCOs) used in a multi channel signal detect radio formed in accordance with the present invention need only be wide enough in frequency range to cover the local oscillator (L.O.) requirements of the desired frequency scan list. Accordingly, depending upon the channel spacing and number of channels in the system design, the number of VCO/PLL circuits can be reduced or the VCO/PLL frequency coverage bandwidth can be reduced, thereby reducing the impact on the scan time. Additionally, the scan procedure of the present invention provides the advantage of using fewer VCO/PLL programming steps than typically required of other prior art scan procedures. Prior art scan procedures require that the VCO/PLL be reprogrammed for each channel in the frequency scan list during the search for signal activity, taking up considerable time.

Figure 6:
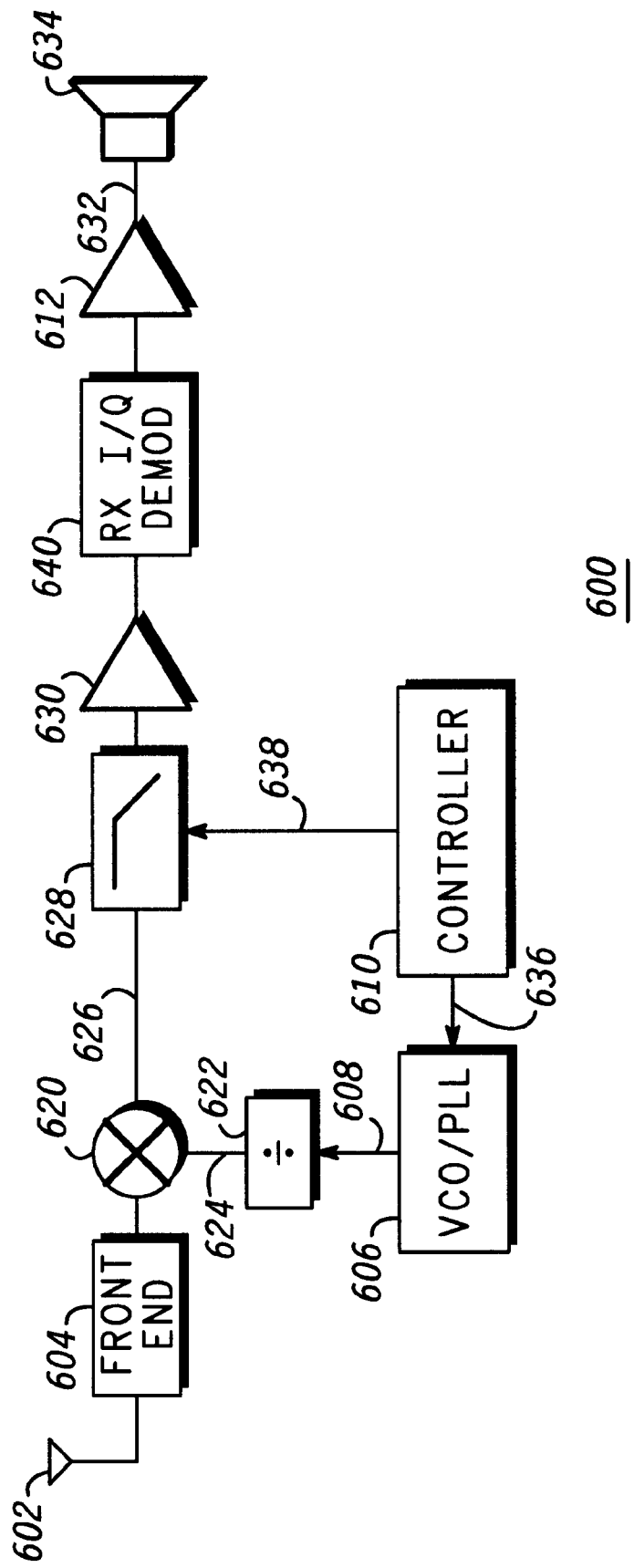
FIG. 6 is a block diagram of a radio in accordance with the present invention.

FIG. 6 is a block diagram of a radio receiver 600 in accordance with the present invention. In accordance with the present invention, receiver 600 includes a means for processing a radio frequency (RF) signal into a baseband signal 626 and includes a programmable baseband filter 628 having multiple bandwidth settings that cover corresponding adjacent frequency channels thereby allowing for more than one channel frequency to be scanned at a time without reprogramming the VCO/PLL for each channel scan.

The receiver 600, preferably a direct conversion 10 receiver, includes an antenna 602 for receiving the RF signal, a receiver front end 604 for processing the RF signal into a processed RF signal, phase lock loop incorporating VCO circuitry 606 for generating a local oscillator signal 608, and controller 610 for controlling a variety of functions within the receiver. The receiver front end 604 can be formed of a variety of circuitry known in the art, such as harmonic and passband filters, low noise amplifier, etc. (not shown). A mixer 620 combines the processed RF signal received from the receiver front end 604 with a divided LO signal 624 (divided by divider 622) to provide the baseband signal 626. Baseband signal 626 gets filtered through baseband filter 628, then amplified through baseband receive amplifier 630, demodulated through demodulator 640, and is ultimately sent through as an audio signal 632 to the speaker 634. The controller 610, preferably formed of a microprocessor, programs the VCO/PLL 606 through program line 636 with appropriate channel information in accordance with the scanning technique of the present invention. Further, in accordance with the present invention, the controller sets the baseband filter's 628 bandwidth through control line 638.

In accordance with the present invention, the radio receiver 600 enters into a scan mode of operation, preferably on the previous channel of operation, and the controller ensures that the VCO/PLL 606 is programmed with the correct channel information and that the baseband filter 628 is set with the appropriate bandwidth information. As the radio is unmuted, any detected audio signals are heard through the speaker 634. During the other steps of the scan technique, the radio remains muted (i.e. any detected RF signals accompanying audio information are not broadcast to the speaker). Muting may be accomplished in a variety of ways known in the art, such as by having the controller send a signal to the audio amplifier 612 disabling the audio signal and thus preventing audio from being delivered to speaker 634.

The scanning technique of the present invention, programs channel settings, sets bandwidths, and monitors signal activity. If the baseband bandwidth needs to be reset per FIG. 1–4 decisions, the controller 610 sends corresponding baseband information to baseband filter 628 via control line 638. Programming of the VCO/PLL 606 to a new block of channel frequencies is controlled through control line 636.

As long as a signal is detected, the VCO/PLL 606 does not need to be reprogrammed. This is significant, because programming the VCO/PLL to a new channel accounts for the longest time step typically seen in most scan procedures.

The scanning technique of the present invention, by way of programmable baseband filter bandwidth, does not require reprogramming the frequency of the VCO/PLL 606 for every individual channel scan. Only when a new frequency block in the procedure is to be scanned (e.g. at step 110) and also when the signal detection scan procedure narrows in on the detected signal (to the exact channel), does the VCO/PLL need to be reprogrammed to a new channel setting. Again, this amounts to significant time savings, particularly for cases in which the scan begins on CH1 and ultimately detects a signal on the last channel. Existing scan methods would require some fourteen VCO/PLL reprogramming steps to check all fourteen channels of the FRS radio described in the example. The scanning technique of the preferred embodiment, by contrast, would use only six reprogramming steps.

The scan method of the present invention enhances radio performance by allowing the radio to lock on to a detected frequency more quickly. The scanning method of the present invention is particularly well suited for Family Radio Service (FRS) radios, scanners, and retail business radios requiring short scan times to scan multiple channels.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of channel scanning in a radio receiver, including the steps of:

enabling scanning operation on a predetermined channel while in standby mode using an initial bandwidth setting, the initial bandwidth setting covering multiple frequency channels;

scanning for channel activity within the initial bandwidth setting;

narrowing the bandwidth setting when channel activity is detected;

scanning for channel activity within the narrower bandwidth setting;

repeating the steps of "narrowing" and "scanning within the narrower bandwidth setting" until channel activity is no longer detected or until the narrowest bandwidth setting has been reached; and locking on to a channel frequency corresponding to the narrowest bandwidth setting at which channel activity is detected.

2. The method of claim 1, wherein the initial bandwidth setting covers a block of frequencies that are part of a scan list and the initial bandwidth setting is selected based on the number of channel frequencies in the scan list and the channel spacing between the channel frequencies.

3. The method of claim 1, wherein the radio is a Family Radio Service (FRS) radio and the initial bandwidth setting covers an initial channel as well as two adjacent channels.

4. The method of claim 1, further comprising the steps of:

reprogramming the radio to a new channel frequency if no channel activity was detected on the predetermined channel; and repeating the steps of "enabling scanning with the initial bandwidth setting" to "locking" using the new channel frequency.

5. A scan method for a radio, comprising the steps of:

setting the radio to a predetermined frequency channel;

scanning for channel activity using a programmable bandwidth setting initially set wide enough to cover a block of frequency channels;

narrowing the bandwidth setting when channel activity is present;

continuing to narrow the bandwidth setting until channel activity is no longer detected or until a predetermined narrowest bandwidth setting has been reached; and locking on to the frequency channel at the narrowest bandwidth setting at which channel activity is present; and if no channel activity has been detected throughout any of the previous steps, repeating the steps of scanning through locking using another predetermined frequency channel.

6. The method of claim 5, wherein the radio is in standby mode during the steps of scanning.

* * * * *